(12) United States Patent
Okuno et al.

(10) Patent No.: US 9,508,469 B2
(45) Date of Patent: Nov. 29, 2016

(54) PEELABLE SUPERCONDUCTIVE CONDUCTOR, PRODUCTION METHOD OF PEELABLE SUPERCONDUCTIVE CONDUCTOR, AND REPAIR METHOD FOR SUPERCONDUCTING WIRE

(71) Applicant: FURUKAWA ELECTRIC CO., LTD., Chiyoda-ku, Tokyo (JP)

(72) Inventors: Yuko Okuno, Tokyo (JP); Yoshikazu Okuno, Tokyo (JP); Yoshinori Nagasu, Tokyo (JP); Masaru Higuchi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/775,640

(22) PCT Filed: Feb. 5, 2014

(86) PCT No.: PCT/JP2014/052635
§ 371 (c)(1),
(2) Date: Sep. 11, 2015

(87) PCT Pub. No.: WO2014/141776
PCT Pub. Date: Sep. 18, 2014

(65) Prior Publication Data
US 2016/0027556 A1 Jan. 28, 2016

(30) Foreign Application Priority Data
Mar. 13, 2013 (JP) .................. 2013-050192

(51) Int. Cl.
*H01B 12/06* (2006.01)
*H01L 39/14* (2006.01)
(Continued)

(52) U.S. Cl.
CPC .......... *H01B 12/06* (2013.01); *H01B 13/0036* (2013.01); *H01L 39/02* (2013.01); *H01L 39/143* (2013.01); *H01L 39/24* (2013.01); *H01L 39/2454* (2013.01)

(58) Field of Classification Search
CPC ..... H01B 12/06; H01B 13/036; H01L 39/02; H01L 39/143; H01L 39/24; H01L 39/2454
See application file for complete search history.

(56) References Cited

U.S. PATENT DOCUMENTS 6,159,905 A * 12/2000 Buzcek .................. H01L 39/02
174/125.1
6,561,412 B2 * 5/2003 Maeda .................. H01L 39/02
228/246

(Continued)

FOREIGN PATENT DOCUMENTS

CN 1364320 A 8/2002
CN 102414764 A 4/2012

(Continued)

OTHER PUBLICATIONS

International Preliminary Report on Patentability mailed Sep. 15, 2015 for PCT Application Serial No. PCT/JP2014/052635, 9 pages.

(Continued)

*Primary Examiner* — Colleen Dunn
(74) *Attorney, Agent, or Firm* — Amin, Turocy & Watson, LLP

(57) ABSTRACT

A peelable superconductive conductor comprising a superconductive conductor including a substrate and a superconducting layer which is formed on one principal surface of the substrate. The peelable superconductive conductor can further comprise a peelable carrier body, which is formed on a principal surface of the superconductive conductor on an opposite side of the surface on which the superconducting layer is formed.

11 Claims, 4 Drawing Sheets

(51) Int. Cl.
*H01L 39/02* (2006.01)
*H01L 39/24* (2006.01)
*H01B 13/00* (2006.01)

(56) References Cited

U.S. PATENT DOCUMENTS

| | | | |
|---|---|---|---|
| 6,893,732 | B1 | 5/2005 | Fritzemeier et al. |
| 8,808,492 | B2 * | 8/2014 | Huang .................... H01L 39/24 |
| | | | 156/272.2 |
| 2012/0021917 | A1 | 1/2012 | Sakamoto et al. |

FOREIGN PATENT DOCUMENTS

| | | |
|---|---|---|
| EP | 2490275 A1 | 8/2012 |
| JP | H04-104993 A | 4/1992 |
| JP | H05-294630 A | 11/1993 |
| JP | 2009-187743 A | 8/2009 |
| JP | 2011233294 A | 11/2011 |
| JP | 2012-169272 A | 9/2012 |
| JP | 2013-114961 A | 6/2013 |
| WO | 0108233 A2 | 2/2001 |
| WO | 2006110637 A2 | 10/2006 |

OTHER PUBLICATIONS

International Search Report mailed Mar. 25, 2014 for PCT Application Serial No. PCT/JP2014/052635, 4 pages.
Extended European Search Report mailed Apr. 8, 2016 for European Patent Application No. 14765069.1, 6 pages.
Chinese Office Action mailed Jun. 2, 2016 for Chinese Patent Application No. 201480012012.4, 16 pages (with translation).

* cited by examiner

ROLLING, THERMAL PROCESSING

FILM FORMING

ACID DIPPING

PEELABLE SUPERCONDUCTIVE CONDUCTOR, PRODUCTION METHOD OF PEELABLE SUPERCONDUCTIVE CONDUCTOR, AND REPAIR METHOD FOR SUPERCONDUCTING WIRE

CROSS-REFERENCE TO RELATED APPLICATIONS

This application is a U.S. National Stage patent application filing under 35 USC §371 of international Patent Cooperation Treaty (PCT) Application No. PCT/JP2014/052635, filed on Feb. 5, 2014, and entitled "PEELABLE SUPERCONDUCTOR, PEELABLE SUPERCONDUCTOR PRODUCTION METHOD, AND REPAIR METHOD FOR SUPERCONDUCTING WIRE," which claims priority to Japanese Patent Application No. 2013-050192, filed on Mar. 13, 2013, both of which applications are hereby incorporated by reference herein in their entireties.

TECHNICAL FIELD

The present invention relates to a peelable superconductive conductor, a peelable superconductive conductor production method, and a repair method for superconducting wire using a peelable superconductive conductor. Specifically, the present invention relates to a peelable superconductive conductor for repair, a peelable superconductive conductor production method, and a repair method for superconducting wire using a peelable superconductive conductor.

BACKGROUND ART

As a method for repairing a defect portion in a superconducting layer of a tape shaped superconducting wire in which a superconducting layer is formed on one side of a tape shaped substrate, the following method is disclosed. A tape shaped superconducting wire for repair is soldered to a surface of a stabilizing layer corresponding to the defect portion, and a channel for electric current is formed making a detour of the defect portion of the superconducting layer of the superconducting wire (for example, see patent document 1).

PRIOR ART DOCUMENT

Patent Document

Patent Document 1: Japanese Patent Application Laid-Open Publication No. 2009-187743

DISCLOSURE OF THE INVENTION

Problems to be Solved by the Invention

However, according to the superconducting wire for repair used in the repair method disclosed in patent document 1, the thickness of the substrate is thinner than the substrate of the superconducting wire which is to be repaired, and the thickness of the substrate is thin, specifically, 30 μm to 50 μm. Therefore, there are problems such as the superconducting wire for repair needs to be handled with care, and forming a superconducting layer on a thin substrate is very difficult from the viewpoint of handling in production.

The present invention was made in view of the above problems, and the object of the present invention is to provide a peelable superconductive conductor which is attached to a carrier body, which includes a thin substrate, and in which handling is made easy.

Means for Solving the Problem

A peelable superconductive conductor including:
a superconductive conductor including a substrate and a superconducting layer which is formed on one principal surface of the substrate; and
a peelable carrier body which is formed on a principal surface of the superconductive conductor on an opposite side of the surface on which the superconducting layer is formed.

According to the peelable superconductive conductor, an extremely thin superconductive conductor is made for repair and connecting the superconducting wire, and the peelable superconductive conductor is adjusted and attached so that the superconductive conductor can be peeled from the carrier body. In repair, the carrier body can be peeled from the peelable superconductive conductor before connecting to the superconducting wire to be repaired or the peelable superconductive conductor can be attached to the portion to be repaired and then the carrier body can be peeled from the peelable superconductive conductor.

When the carrier body is peeled from the peelable superconductive conductor after attaching the peelable superconductive conductor to the portion to be repaired, even if the thickness of the substrate of the repairing superconductive conductor is 30 μm or less, the repair can be performed without applying damage to the repairing superconductive conductor.

The configuration other than the substrate (for example, intermediate layer, superconducting layer, protecting layer, etc.), the superconducting characteristics (specifically, Ic value [critical current value]), needs to be similar to the superconducting wire which is to be repaired or connected. Therefore, generally, the configuration is the same as the superconducting wire to be repaired or connected.

A production method of a peelable superconductive conductor including:
forming a peelable carrier body on one principal surface of a substrate; and
forming a superconducting layer on a principal surface of the substrate on an opposite side of the surface on which the carrier body is formed.

The producing method of the peelable superconductive conductor is a method of attaching the carrier body in film forming. The obtained superconductive conductor and carrier body can be used as is for repair, and the carrier body is peeled in repair.

Preferably, the carrier body is able to resist high temperature in forming the super conducting film and has good thermal conductivity. Therefore, material the same as the thin film substrate for film forming is preferable, but alloy which is cheaper in cost can also be used.

A production method of a peelable superconductive conductor including:
forming a handling carrier body on one principal surface of a substrate;
forming a superconducting layer on a principal surface of the substrate on an opposite side of the surface on which the handling carrier body is formed;

removing the handling carrier body; and forming a peelable carrier body on the principal surface on a side from which the handling carrier body is removed.

The producing method of the peelable superconductive conductor is a method in which the handling carrier body attached in film forming is peeled and a different carrier body for repair is attached.

Preferably, the handling carrier body is also able to resist high temperature in forming the super conducting film and has good thermal conductivity. Therefore, material the same as the thin film substrate for film forming is preferable, but alloy which is cheaper in cost can also be used. On the other hand, the repairing carrier body does not receive thermal history, and therefore can be metallic or plastic.

A repair method for a superconducting wire including:

preparing a peelable superconductive conductor in which a superconducting layer is formed on one principal surface of a substrate and a peelable carrier body is formed on an other principal surface;

specifying an Ic deteriorated portion of a superconducting wire including the Ic deteriorated portion in a portion of the superconducting wire;

removing the carrier body from the superconductive conductor; and electrically connecting the superconductive conductor with the carrier body removed to the superconducting wire so as to cover the Ic deteriorated portion.

Since the repairing superconductive conductor with the carrier body removed is connected to the Ic deteriorated portion, the thin superconductive conductor can be easily attached to the location of Ic deterioration, and it is possible to form a channel for electric current to detour the Ic deteriorated portion.

Advantageous Effect of the Invention

According to the present invention, it is possible to provide a peelable superconductive conductor which is attached to a carrier body, which includes a thin substrate, and in which handling is made easy.

EMBODIMENT FOR CARRYING OUT THE INVENTION

An embodiment for carrying out the present invention (hereinafter referred to as an embodiment) is described in detail with reference to the attached drawings.

First Embodiment

The peelable superconductive conductor of the first embodiment of the present invention is obtained by the following, in film forming, a superconducting layer is formed with a "handling carrier body" attached to a film forming substrate, and then the "handling carrier body" is peeled and attached to a "repair carrier body". Three methods are described below.

<Method of Partially Joining Film Forming Substrate to Handling Carrier Body>

The film forming substrate is partially joined to the handling carrier body, an intermediate layer, a superconducting layer, and a protecting layer are formed on the film forming substrate, the joint is removed (cut), and the handling carrier body is peeled and attached to the repair carrier body to produce a repairing superconductive conductor.

Figure 1:
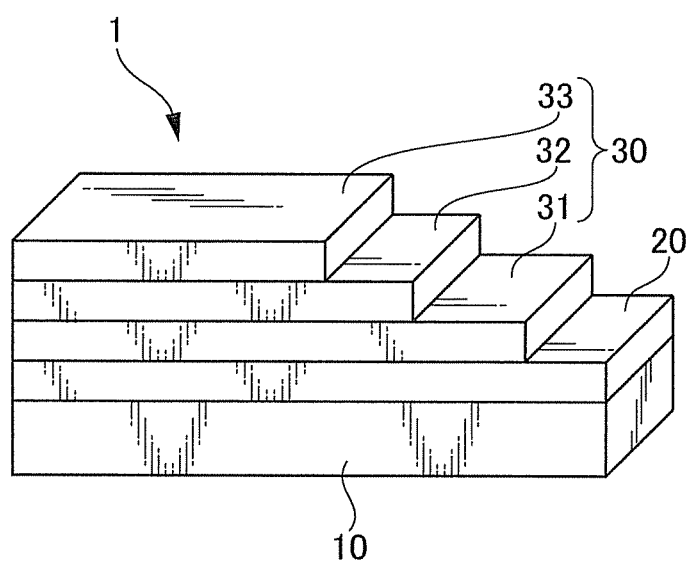
FIG. 1 is a perspective diagram showing a structure of layers in a superconductive conductor according to an embodiment of the present invention.
Figure 2A:
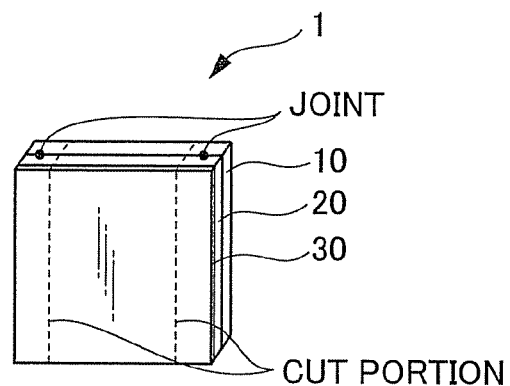
FIG. 2A is a diagram describing a joint in both edges in a width direction in a method of partially joining a film forming substrate to a handling carrier body according to the first embodiment of the present invention.
Figure 2B:
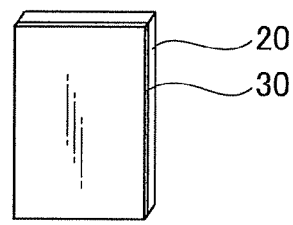
FIG. 2B is a diagram describing a state in which a joint shown in FIG. 2A is cut.
Figure 2C:
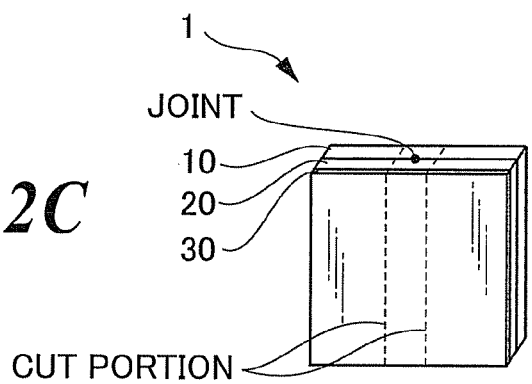
FIG. 2C is a diagram describing a joint in a center portion in the width direction in a method of partially joining the film forming substrate to the handling carrier body according to the first embodiment of the present invention.

As shown in FIG. 2A and FIG. 2C, a tape shaped extremely thin substrate (thickness with 3 to 50 μm) formed from a Ni based or Fe based alloy such as hastelloy, stainless steel, etc. is prepared as a film forming substrate 20. On one face of the film forming substrate 20, a handling carrier body 10 including a metal such as brass with a thickness so that the total thickness of the film forming substrate 20 and the handling carrier body 10 becomes 70 to 120 μm is placed on the film forming substrate 20. The handling carrier body 10 is joined with the film forming substrate 20 at both edges in the width direction and/or successively or non-successively in the longitudinal direction in one or more spots in the width direction. Preferably, the substrate used for the repairing (connecting) superconductive conductor is 50 μm or smaller to suppress the thickness of the repaired (connected) location.

FIG. 2A shows an example in which there are joints in both edges, and FIG. 2C shows an example in which there is a joint, in the center portion.

Surface polishing is performed by mechanical polishing or electric field polishing on the face of the film forming substrate 20 opposite of the face on which the handling carrier body 10 is attached. Here, preferably, an arithmetic average roughness Ra of the surface of the film forming substrate 20 on which surface polishing is performed is 5 nm or less, and more suitably 2 nm or less.

Then, for example, a bed layer with a thickness of 100 nm formed from $Gd_2Zr_2O_7$ is formed using a sputtering apparatus on the film forming substrate 20 with the surface polished. An alignment layer (IBAD-MgO layer) including MgO is formed by an IBAD method on the bed layer at room temperature to be 10 to 200 angstrom. Further, a LMO layer which is an oxide layer including crystalline material represented with a composition formula of $LaMnO_{3+}\delta$ ($\delta$ is oxygen non-stoichiometric amount) is formed on the alignment layer by a RF sputtering method to be 4 to 100 nm. Preferably, the LMO layer is an oxide layer including a crystalline material represented by a composition formula $La_z(Mn_{1-x}M_x)_WO_{3+}\delta$ ($\delta$ is at least one selected from Cr, Al, Co and Ti, $\delta$ is oxygen non-stoichiometric amount, and $0<z/W<2$, $0<x\leq1$) from the viewpoint of being able to make the phase transition temperature at which the crystal lattice of LMO becomes cubic crystal low. The value of $\delta$ is not limited, and is for example, $-1<\delta<1$. A cap layer including $CeO_2$ is formed on the oxide layer by sputtering method at 650° C. to be 200 nm, and this is to be an intermediate layer 31 of 3 layers. The LMO layer formed between the alignment layer and the cap layer includes the function of enhancing the lattice match of the cap layer. A superconducting layer 32 including a RE type superconductive conductor (RE is a single rare earth element or a plurality of rare earth elements such as Y, Nd, Sm, Eu, Gd, Dy, Ho, Er, Tm, Yb, Lu, etc., $\lambda$ is oxygen non-stoichiometric amount, for example, 0 or more and 1 or less) represented by a composition formula of YBCO, etc. being $REBa_2Cu_3O_7\lambda$ on the cap layer by MOCVD method at 845° C. with a thickness of 1 µm. An Ag or Ag alloy layer is formed on the superconducting layer using a sputtering method as a protecting layer (stabilizing layer) 33 with a thickness of 20 µm. With this, a superconductive conductor 1 is formed.

As the bed layer, other than $Gd_2Zr_2O_7$, the following can be used, $YAlO_3$ (yttrium aluminate), YSZ (yttria stabilized zirconia), $Y_2O_3$, $Gd_2O$, $Al_2O_3$, $B_2O_3$, $Sc_2O_3$, $Cr_2O_3$, REZrO, $CeO_2$, $PrO_2$, $RE_2O_3$, etc. can be used. Here, RE represents a single rare earth element or a plurality of rare earth elements.

A film forming layer 30 includes the intermediate layer 31, the superconducting layer 32, and a protecting layer (stabilizing layer) 33.

Figure 2D:
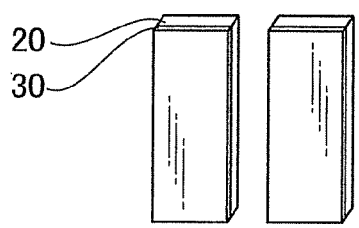
FIG. 2D is a diagram describing a state in which a joint shown in FIG. 2C is cut.

As shown in FIG. 2B and FIG. 2D, the joint between the substrate 20 and the handling carrier body 10 is cut in the longitudinal direction (scissors or a cutting tool can be used, but when the length is long, a slitter or laser is used for cutting) and the handling carrier body 10 is removed from the obtained superconductive conductor 1 to obtain the extremely thin superconductive conductor. The extremely thin superconductive conductor is attached to a repairing carrier body (metal plate or resin plate, for example, stainless steel plate, polypropylene plate, polypropylene terephthalate (PPT) resin plate) using double-sided tape with a very weak adhesion (for example, double-sided tape using recycled paper such as the product "Nicetack (registered trademark) Rimka (registered trademark)") as an adhesive layer.

Among the above repairing carrier bodies, when the repairing (connecting) superconductor (peelable superconductor) in a state connected to the repairing carrier body is connected to the superconducting wire to be repaired (connected) by soldering, etc., the repairing carrier body which has heat resistance against heat generated in connection by soldering should be selected. Specifically, preferably, the metal plate (stainless steel plate) or PPT resin plate is used in the repairing carrier body. When connection by soldering is performed in the state in which the repairing carrier body is connected, even if the thickness of the repairing superconductive conductor substrate is less than 30 µm and extremely thin, connection is possible without damaging the repairing superconductive conductor. When the substrate is extremely thin, it is preferable that the repairing carrier body has high strength. Specifically, it is preferable to use the metal plate (hastelloy plate, stainless steel plate) as the repairing carrier body.

One face of the repairing carrier body can be a tape shaped sheet (for example, masking tape, curing tape, etc.) which has an adhesive face, and in this case the above-described adhesive layer is not necessary. Preferably, the adhesion of the double-sided tape or the tape shaped sheet with one face being an adhesive face in relation to the film forming substrate 20 is within the range of 0.5 to 5 N.

The film forming substrate 20 and the handling carrier body 10 can be joined by laser welding, spot welding, joining with adhesive for metal with high temperature resistance (for example, product (927° C.), Durabond 952 (1090° C.), etc.), joining by brazing material (for example, Cu-ABA (1000° C. or more), CUSIL-ABA (850° C.), etc.), diffusion joining (heating and compressing joining material in a vacuum state or under argon atmosphere, and joining using diffusion of atoms).

Preferably, the handling carrier body resists high temperature generated when the superconducting film is formed and has high thermal conductivity. Therefore, preferably, the material the same as the extremely thin substrate for film forming is used.

<Method of Entirely Joining Film Forming Substrate to Handling Carrier Body>

The film forming substrate is joined to the handling carrier body by pressure welding, the intermediate layer, the superconducting layer, and the protecting layer are formed on the film forming substrate, the handling carrier body is melted and removed by dipping in acid, and the result is attached to the repairing carrier body to produce the repairing superconductive conductor.

Figure 3A:
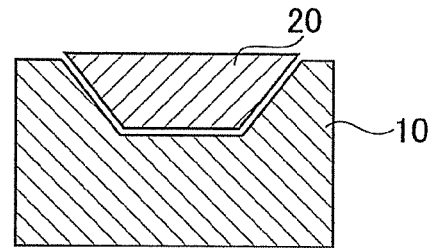
FIG. 3A is a diagram describing a method of completely joining the film forming substrate with the handling carrier body according to the first embodiment and the second embodiment of the present invention.
Figure 3B:
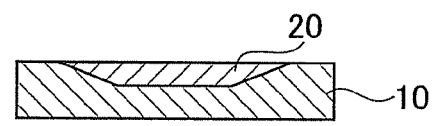
FIG. 3B is a diagram describing the next process after FIG. 3A.
Figure 3C:
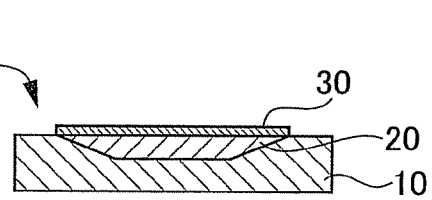
FIG. 3C is a diagram describing the next process after FIG. 3B.
Figure 3D:
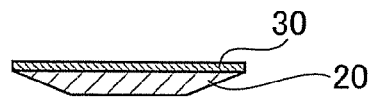
FIG. 3D is a diagram describing the next process after FIG. 3C.

As shown in FIG. 3A, a tape shaped extremely thin substrate formed from a Ni based or Fe based alloy such as hastelloy, stainless steel, etc. is prepared as a film forming substrate 20. A handling carrier body 10 including a metal such as brass is placed on one face of the film forming substrate 20. As shown in FIG. 3B, warm or cold rolling is performed with a rolling mill so that the total thickness becomes 70 to 120 µm. Then, thermal processing at a temperature of about 650° C. is performed. With this, a substrate in which two metals are completely joined is formed. A peeling material can be placed between the film forming substrate 20 and handling carrier body 10 and rolled to prevent joining of the metals. Next, as shown in FIG. 3C, the intermediate layer 31, the superconducting layer 32, and the protecting layer 33 are similarly formed on the film forming substrate 20 to produce the superconductive conductor 1. As shown in FIG. 3D, the obtained superconductive conductor 1 is dipped in a solution of acid such as sulfuric acid, etc. which melts only the handling carrier body 10, and melts and removes the handling carrier body 10 to obtain the extremely thin superconductive conductor.

Similar to the above, the extremely thin superconductive conductor is attached to a repairing carrier body (metal plate or resin plate, for example, stainless steel plate, polypropylene plate, polypropylene terephthalate (PPT) resin plate) using double-sided tape with a very weak adhesion (for example, double-sided tape using recycled paper such as the product "Nicetack (registered trademark) Rimka (registered trademark)") as an adhesive layer.

Among the above repairing carrier bodies, when the repairing (connecting) superconductor (peelable superconductor) in a state connected to the repairing carrier body is connected to the superconducting wire to be repaired (connected) by soldering, etc., the repairing carrier body which has heat resistance against heat generated in connection by soldering should be selected. Specifically, preferably, the metal plate (stainless steel plate) or PPT resin plate is used in the repairing carrier body. When connection by soldering is performed in the state in which the repairing carrier body is connected, even if the thickness of the repairing superconductive conductor substrate is less than 30 μm and extremely thin, connection is possible without damaging the repairing superconductive conductor. When the substrate is extremely thin, it is preferable that the repairing carrier body has high strength. Specifically, it is preferable to use the metal plate (hastelloy plate, stainless steel plate) as the repairing carrier body.

One face of the repairing carrier body can be a tape shaped sheet (for example, masking tape, curing tape, etc.) which has an adhesive face, and in this case the above-described adhesive layer is not necessary. Preferably, the adhesion of the double-sided tape or the tape shaped sheet with one face being an adhesive face in relation to the film forming substrate 20 is within the range of 0.5 to 5 N.

<Method of Integrating Handling Carrier Body with Film Forming Substrate by Swaging>

Figure 4A:
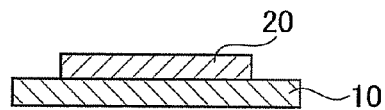
FIG. 4A is a diagram describing a method of swaging the handling carrier body to be integrated with the film forming substrate according to the first embodiment of the present invention.
Figure 4B:
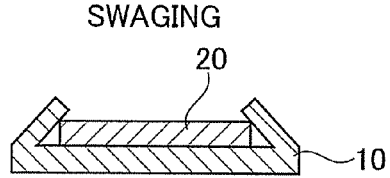
FIG. 4B is a diagram describing the next process after FIG. 4A.
Figure 4C:
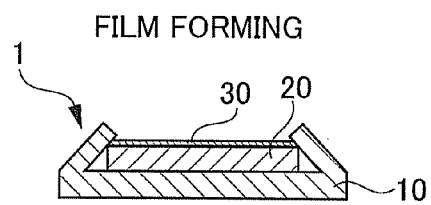
FIG. 4C is a diagram describing the next process after FIG. 4B.
Figure 4D:
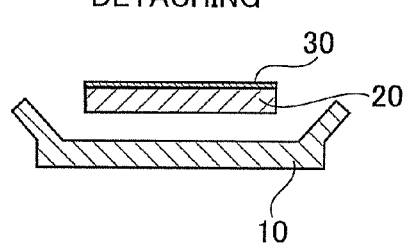
FIG. 4D is a diagram describing the next process after FIG. 4C.

As shown in FIG. 4A, a tape shaped extremely thin film forming substrate formed from a Ni based or Fe based alloy such as hastelloy, stainless steel, etc. is prepared as a film forming substrate 20. On one face of the extremely thin film forming substrate, a handling carrier body 10 slightly larger than the extremely thin film forming substrate and including a metal such as brass is placed on the extremely thin film forming substrate. As shown in FIG. 4B, a punch for swaging is used to form a substrate partially swaging two metals. As shown in FIG. 4C, the intermediate layer 31, the superconducting layer 32, and the protecting layer 33 are formed on the film forming substrate 20 with a method similar to the above-described method. With this, the superconductive conductor 1 is produced. As shown in FIG. 4D, the swaging portion of the handling carrier body of the obtained superconductive conductor is mechanically extended to remove the handling carrier body. With this the extremely thin superconductive conductor is obtained.

Similar to the above, the extremely thin superconductive conductor is attached to a repairing carrier body (metal plate or resin plate, for example, stainless steel plate, polypropylene plate, polypropylene terephthalate (PPT) resin plate) using double-sided tape with a very weak adhesion (for example, double-sided tape using recycled paper such as the product "Nicetack (registered trademark) Rimka (registered trademark)") as an adhesive layer.

Among the above repairing carrier bodies, when the repairing (connecting) superconductor (peelable superconductor) in a state connected to the repairing carrier body is connected to the superconducting wire to be repaired (connected) by soldering, etc., the repairing carrier body which has heat resistance against heat generated in connection by soldering should be selected. Specifically, preferably, the metal plate (stainless steel plate) or PPT resin plate is used in the repairing carrier body. When connection by soldering is performed in the state in which the repairing carrier body is connected, even if the thickness of the repairing superconductive conductor substrate is less than 30 μm and extremely thin, connection is possible without damaging the repairing superconductive conductor. When the substrate is extremely thin, it is preferable that, the repairing carrier body has high strength. Specifically, it is preferable to use the metal plate (hastelloy plate, stainless steel plate) as the repairing carrier body.

One face of the repairing carrier body can be a tape shaped sheet (for example, masking tape, curing tape, etc.) which has an adhesive face, and in this case the above-described adhesive layer is not necessary. Preferably, the adhesion of the double-sided tape or the tape shaped sheet with one face being an adhesive face in relation to the film forming substrate 20 is within the range of 0.5 to 5 N.

Second Embodiment

The peelable superconductive conductor of the second embodiment of the present invention is obtained by the following, in film forming, an intermediate layer, a superconducting layer, and a protecting layer are formed with a handling carrier body attached to a film forming substrate, and then the handling carrier body is used as is as the repairing carrier body. Two methods are described below.

<Method of Entirely Joining Film Forming Substrate to Handling Carrier Body>

The film forming substrate and the handling carrier body are joined by pressure welding, the intermediate layer, the superconducting layer, and the protecting layer are formed on the film forming substrate, and this is to be the repairing superconductive conductor as is. In this case, the handling carrier body becomes the repairing carrier body as is.

Similar to the first embodiment, as shown in FIG. 3A, a tape shaped extremely thin substrate formed from a Ni based alloy such as hastelloy, etc. is prepared as a film forming substrate 20. A handling carrier body 10 made from, for example, brass is placed on one face of the film forming substrate 20. As shown in FIG. 3B, warm or cold rolling is performed with a rolling mill so that the total thickness becomes 70 to 120 μm. Then, thermal processing at a temperature of about 650° C. is performed. With this, a substrate in which two metals are completely joined is formed. Next, as shown in FIG. 3C, the intermediate layer 31, the superconducting layer 32, and the protecting layer 33 are formed on the substrate with a method similar to the first embodiment to produce the superconductive conductor 1. This is to be the peelable superconductive conductor for repair.

<Method in which a Peeling Layer is Placed Between Film Forming Substrate and Handling Carrier Body>

The peeling layer can be placed between the film forming substrate and the handling carrier body. As the peeling layer, material with a high melting point and having heat resistance can be used such as simple metal, alloy, oxide and hydroxide of the following, Ta (melting point 2996° C.), Nb (melting point 2500° C.), Zr (melting point 2127° C.), Ni (melting point 1455° C.), Cr (melting point 1900° C.), Ti (melting point 1727° C.), Fe (melting point 1539° C.), Si (melting point 1410° C.), Mo (melting point 2622° C.), Co (melting point 1478° C.), V (melting point 1697° C.) W (melting point 3382° C.). The substance of the peeling layer can be attached to the handling carrier body by plating method, and the film forming substrate can be formed by the plating method. Inclusion such as carbon can be placed in between in rolling in the method of entirely joining the film forming substrate with the handling carrier body to intentionally enable peeling to become easier.

When the peelable superconductive conductor obtained in the first embodiment and the second embodiment is used to repair an Ic deteriorated portion of the superconducting wire including the Ic deteriorated portion, the repairing carrier body can be easily peeled and removed from the peelable superconductive conductor, and the superconductive conductor including the thin film forming substrate, etc. can be joined to the Ic deteriorated portion by soldering, etc., and a bypass for electric current can be formed. When the repaired portion of the superconducting wire is repaired as described above, the increase of thickness can be suppressed to a minimum, and thickness does not become a problem when processed to a coil, etc.

Specifically, Ic measurement of the superconducting wire including a certain length is performed (for example, TAPE-STAR (registered trademark) of THEVA can be used), and when there is an Ic deteriorated portion, the deteriorated portion is specified, and the superconductive conductor is attached to the deteriorated portion using soldering. Here, preferably, the peelable superconductive conductor is placed and attached on the Ic deteriorated portion so as to overlap on the surrounding area of the deteriorated portion. When attaching, the superconducting layer of the superconductive conductor and the superconducting layer of the peelable superconductive conductor are positioned facing each other.

When the superconducting wires are connected, the peelable superconductive conductor can be used as the connecting superconductive conductor.

Figure 5:
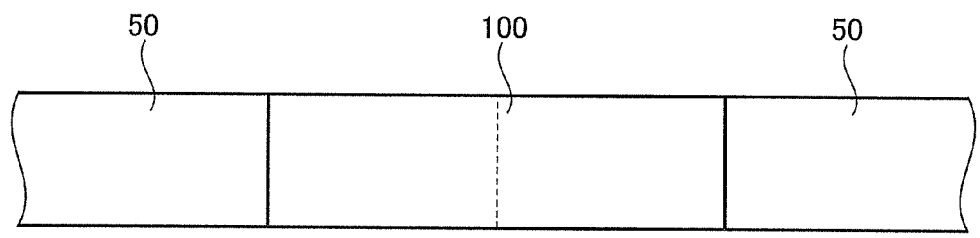
FIG. 5 is a diagram showing an example of using the peelable superconductive conductor of an embodiment of the present invention as a connecting superconductive conductor.

Specifically, as shown in FIG. 5, superconducting wires 50 and 50 are placed against each other and a peelable superconductive conductor 100 is placed crossing across the superconducting wires 50 and 50. The repairing carrier body is held without peeling as reinforcing the handling of the superconducting wire. When finishing as the final product (coil or cable), the carrier body can be peeled. In this case, preferably, a material with high strength such as hastelloy, stainless steel, etc. is used as the reinforcing carrier body.

Although the present invention is described according to the embodiments, the technical scope of the present invention is not limited to the scope as described in the embodiments. It is clear to those skilled in the art that various changes and modifications can be added to the above embodiments. It is also clear from the scope of the claims that embodiments including such changes and modifications are within the technical scope of the present invention.

INDUSTRIAL APPLICABILITY

The present invention is a peelable superconductive conductor, a peelable superconductive conductor production method, and a repair method for superconducting wire, and can be used in a superconductive conductor for repair.

DESCRIPTION OF REFERENCE NUMERALS 1 superconductive conductor
10 handling carrier body
20 film forming substrate
30 film forming layer
31 intermediate layer
32 superconducting layer
33 protecting layer (stabilizing layer)
50 superconducting wire
100 peelable superconductive conductor

The invention claimed is:
1. A peelable superconductive conductor comprising:
  a superconductive conductor including a substrate and a superconducting layer which is formed on one principal surface of the substrate; and
  a peelable carrier body which is formed on a principal surface of the superconductive conductor on an opposite side of the surface on which the superconducting layer is formed.
2. The peelable superconductive conductor according to claim 1, wherein, the carrier body and the superconductive conductor are connected through an adhesive layer.
3. The peelable superconductive conductor according to claim 1, wherein,
  the substrate includes a metal substrate;
  the carrier body includes metal; and
  the metal substrate and the carrier body are partially joined by swaging.
4. The peelable superconductive conductor according to claim 1, wherein,
  the substrate includes a metal substrate; and
  a thickness of the metal substrate is 50 µm or less.
5. A production method of a peelable superconductive conductor comprising:
  forming a peelable carrier body on one principal surface of a substrate; and
  forming a superconducting layer on a principal surface of the substrate on an opposite side of the surface on which the carrier body is formed.
6. The production method of the peelable superconductive conductor according to claim 5, wherein, the carrier body is made from a material which is same as the substrate.
7. A production method of a peelable superconductive conductor comprising:
  forming a handling carrier body on one principal surface of a substrate;
  forming a superconducting layer on a principal surface of the substrate on an opposite side of the surface on which the handling carrier body is formed;
  removing the handling carrier body; and
  forming a peelable carrier body on the principal surface on a side from which the handling carrier body is removed.
8. The production method of the peelable superconductive conductor according to claim 7, wherein,
  the handling carrier body and the substrate include a partially joined joint; and
  the joint is removed in the removing of the handling carrier body.
9. A repair method for a superconducting wire comprising:
  preparing a peelable superconductive conductor in which a superconducting layer is formed on one principal surface of a substrate and a peelable carrier body is formed on an other principal surface;
  specifying an Ic deteriorated portion of a superconducting wire including the Ic deteriorated portion in a portion of the superconducting wire;
  removing the carrier body from the peelable superconductive conductor; and
  electrically connecting the peelable superconductive conductor with the carrier body removed to the superconducting wire so as to cover the Ic deteriorated portion.
10. A repair method for a superconducting wire comprising:
  preparing a peelable superconductive conductor in which a superconducting layer is formed on one principal surface of a substrate and a peelable carrier body is formed on an other principal surface;

specifying an Ic deteriorated portion of a superconducting wire including the Ic deteriorated portion in a portion of the superconducting wire;

electrically connecting by positioning the peelable superconductive conductor with the superconducting layer facing each other so as to cover the Ic deteriorated portion; and removing the carrier body from the peelable superconductive conductor.

11. The repair method for the superconducting wire according to claim 10, wherein a metal substrate composing the substrate has a thickness of 30 μm or less.

* * * * *